United States Patent
Tischler

(10) Patent No.: US 8,049,297 B2
(45) Date of Patent: Nov. 1, 2011

(54) SEMICONDUCTOR STRUCTURE

(75) Inventor: Michael Albert Tischler, Phoenix, AZ (US)

(73) Assignee: HVVi Semiconductors, Inc., Phoenix, AZ (US)

( * ) Notice: Subject to any disclaimer, the term of this patent is extended or adjusted under 35 U.S.C. 154(b) by 132 days.

(21) Appl. No.: 12/330,760

(22) Filed: Dec. 9, 2008

(65) Prior Publication Data

US 2009/0146245 A1  Jun. 11, 2009

Related U.S. Application Data

(60) Provisional application No. 61/012,877, filed on Dec. 11, 2007.

(51) Int. Cl.
   *H01L 21/20* (2006.01)

(52) U.S. Cl. .................. 257/510; 257/347; 257/E29.02

(58) Field of Classification Search .................... 257/68, 257/310, 374, 506, 510, 524, E29.02
   See application file for complete search history.

(56) References Cited

U.S. PATENT DOCUMENTS

| | | | | |
|---|---|---|---|---|
| 5,480,832 A | * | 1/1996 | Miura et al. | 438/404 |
| 6,046,476 A | * | 4/2000 | Morishita et al. | 257/347 |
| 6,136,682 A | * | 10/2000 | Hegde et al. | 438/622 |
| 6,287,908 B1 | * | 9/2001 | Brand | 438/221 |
| 6,326,306 B1 | * | 12/2001 | Lin | 438/687 |
| 6,784,091 B1 | * | 8/2004 | Nuetzel et al. | 438/618 |
| 7,180,116 B2 | * | 2/2007 | Chiang et al. | 257/303 |
| 2005/0032320 A1 | * | 2/2005 | Yokoyama | 438/296 |

* cited by examiner

*Primary Examiner* — Matthew Smith
*Assistant Examiner* — Quovaunda V Jefferson
(74) *Attorney, Agent, or Firm* — Cool Patent, P.C.; Kenneth J. Cool

(57) ABSTRACT

In various embodiments, semiconductor structures and methods to manufacture these structures are disclosed. In one embodiment, a method includes removing a portion of a semiconductor material to form a cavity that extends at least about one micron or greater below the surface of the semiconductor material, filling the cavity with a sacrificial material, forming a dielectric material over the sacrificial material and over at least a portion of the surface of the semiconductor material, and removing a portion of the dielectric material to form an opening to expose a portion of the sacrificial material, wherein the opening has a width that is substantially less than a width of the cavity and the dielectric material is rigid or substantially rigid. The method further includes removing the sacrificial material. Other embodiments are described and claimed.

19 Claims, 4 Drawing Sheets

US 8,049,297 B2

SEMICONDUCTOR STRUCTURE

TECHNICAL FIELD

Embodiments disclosed in the present disclosure relate generally to electrical and semiconductor technology, and more specifically to a semiconductor structure that includes a dielectric structure.

BACKGROUND

For some applications, such as high frequency or radio frequency ("RF") applications, it may be contemplated to form integrated passive devices using semiconductor processing technology or it may be contemplated to integrate passive devices such as inductors and/or capacitors together with active devices such as transistors using conductive silicon substrates. However, passive devices may have relatively low quality factors ("Qs") when these passive devices are formed on, or in relatively close proximity to, the conductive silicon substrate. In addition, due to parasitic capacitive coupling between these passive devices and the conductive silicon substrate, the frequency of operation of the integrated devices is reduced. Electrically conductive interconnects or busses may be used to electrically couple different devices within the die and external to the die. The frequency of operation may also be reduced by parasitic capacitive coupling between the interconnects and the conductive silicon substrate.

Further, it may be contemplated to physically and electrically isolate regions of a semiconductor substrate from each other. Additionally, some semiconductor devices, such as power transistors, provide relatively high output power, which may be utilized in some RF, industrial, and medical applications. Power transistor designers are continually seeking ways to efficiently increase output power by varying the output voltage and current characteristics of a power transistor. For example, it may be contemplated to have a power transistor that has an increased breakdown voltage to enable the power transistor to operate at a relatively higher voltage and provide a relatively higher output power.

Accordingly, it is contemplated to have semiconductor structures, and methods to make these structures, that may provide for reduced parasitic capacitances, relatively higher frequencies of operation, relatively higher breakdown voltages, relatively higher quality factor passive devices, increased isolation, or combinations thereof.

Figure 1:
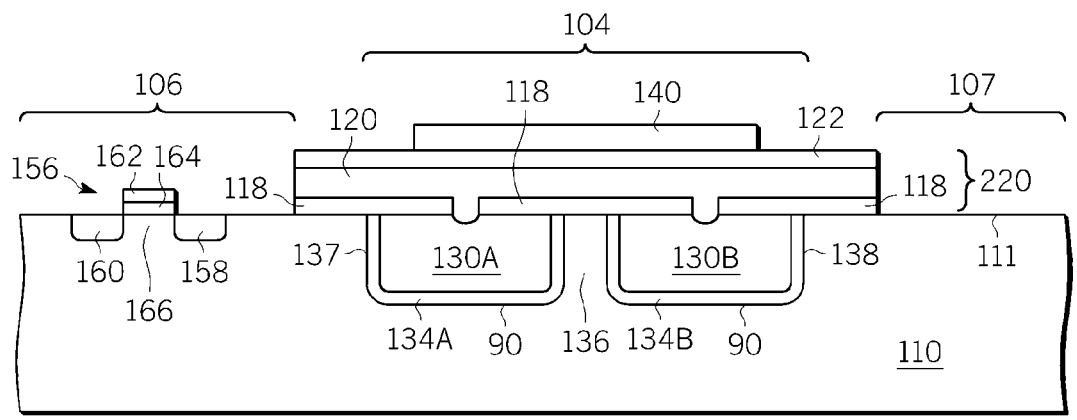
FIG. 1 is a cross-sectional view of a semiconductor structure in accordance with an embodiment of the present invention.

For simplicity of illustration and ease of understanding, elements in the various figures are not necessarily drawn to scale, unless explicitly so stated. Further, if considered appropriate, reference numerals have been repeated among the figures to indicate corresponding and/or analogous elements.

DETAILED DESCRIPTION

In some instances, well-known methods, procedures, components and circuits have not been described in detail so as not to obscure the present disclosure. The following detailed description is merely exemplary in nature and is not intended to limit the disclosure of this document and uses of the disclosed embodiments. Furthermore, there is no intention that the appended claims be limited by the title, technical field, background, or abstract.

In the following description and claims, the terms "comprise" and "include," along with their derivatives, may be used and are intended as synonyms for each other. In addition, in the following description and claims, the terms "coupled" and "connected," along with their derivatives, may be used. "Connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other. For example, "coupled" may mean that two or more elements do not contact each other but are indirectly joined together via another element or intermediate elements. Finally, the terms "on," "overlying," and "over" may be used in the following description and claims. "On," "overlying," and "over" may be used to indicate that two or more elements are in direct physical contact with each other. However, "over" may also mean that two or more elements are not in direct contact with each other. For example, "over" may mean that one element is above another element but not contact each other and may have another element or elements in between the two elements.

FIG. 1 is a cross-sectional view of a semiconductor structure 100 that illustrates a dielectric platform (DP) 104, active regions 106 and 107, and an electrically conductive material 140. Dielectric platform 104 may be referred to as a dielectric structure or a dielectric region, and active regions 106 and 107 may also be referred to as active areas or active area regions or portions of active areas since active devices, or portions of active devices, are formed in active areas 106 and 107.

Dielectric platform 104 of semiconductor structure 100 (FIG. 1) comprises a vertical structure 136, sealed voids 130A and 130B, dielectric materials 134A and 134B, and portions of dielectric materials 118, 120, and 122 over vertical structure 136, sealed voids 130A and 130B, and dielectric materials 134A and 134B. As will be discussed further below, at least a portion of dielectric platform 104 may be between electrically conductive material 140 and substrate 110 to reduce parasitic capacitance between electrically conductive material 140 and substrate 110. In other embodiments of the present invention, at least a portion of dielectric platform 104 is between at least a portion of electrically conductive material 140 and at least a portion of substrate 110 to reduce capacitance between electrically conductive material 140 and substrate 110.

Active regions 106 and 107 are comprised of a portion of substrate 110. In some embodiments of the present invention, substrate 110 may be referred to as a device layer or an active layer. Further, in some embodiments, substrate 110 may include one or more epitaxial layers. Substrate 110 may be used as an active area where active devices, such as, for example, transistors or diodes, or portions of active devices, may be subsequently formed. Active devices may be formed in active regions 106 and 107 using conventional MOS (metal oxide semiconductor), complementary metal oxide semiconductor (CMOS), bipolar, or bipolar-CMOS (BiCMOS) processes.

Substrate 110 may comprise a semiconductor material such as, for example, silicon, and may be doped or undoped depending on the application.

In some embodiments, the depth or thickness of dielectric platform 104 may range from about 1 µm to about 40 µm and the width of dielectric platform 104 may be at least about 3 µm or greater. The width of dielectric platform 104 can be measured from a lateral boundary 137 of dielectric layer 134A to a lateral boundary 138 of dielectric layer 134B. In some embodiments, lateral boundary 137 is parallel to, or substantially parallel to, lateral boundary 138, and lateral boundary 137 is perpendicular to, or substantially perpendicular to, a top surface 111 of substrate 110, although the methods and apparatuses described herein are not limited in this regard. For example, in alternate embodiments, lateral boundary 137 may be non-perpendicular to top surface 111 and may be non-parallel to lateral boundary 138. The depth or thickness of dielectric platform 104 may be measured from top surface 111 of substrate 110 to a lower boundary or surface 90 of dielectric platform 104. Lower surface 90 of dielectric platform 104 is parallel to, or substantially parallel to surface 111 of substrate 110. In some embodiments, lower surface 90 of dielectric platform 104 is at a distance of at least about one micron or greater below surface 111 and the width of dielectric platform 104 is at least about three microns or greater. In other embodiments, lower surface 90 of dielectric platform 104 is at a distance of at least about three microns or greater below surface 111 and the width of dielectric platform 104 is at least about five microns or greater. In one example, the thickness of dielectric platform 104 may be about 10 µm and the width of dielectric platform 104 may be about 10 µm. In yet other embodiments, it may be desirable that the thickness of the dielectric platform be equal to, or approximately equal to, the thickness of semiconductor substrate 110, for example, the thickness of the semiconductor die and the width of dielectric platform 104 may be up to about 100 µm. The thickness and width of dielectric platform 104 may be varied depending on the application for dielectric platform 104 and the desired die size of the resulting semiconductor device that uses substrate 110. For example, a relatively thicker dielectric platform may be desired in applications where dielectric platform 104 is used to form high Q passive devices compared to an application where dielectric platform 104 is used for isolation.

Sealed voids 130A and 130B may also be referred to as sealed air gaps, closed cells, or closed cell voids. In some embodiments, the width of sealed voids 130A and 130B may be at least 1.5 µm or greater. For example, the width of sealed voids 130A and 130B may be up to about 50 µm in some embodiments. In some embodiments, sealed voids 130A and 130B are hermetically sealed to prevent any contamination from undesirable gasses or moisture that may propagate into sealed voids 130A and 130B. Further, in some embodiments, sealed voids 130A and 130B are evacuated to a pressure less than atmospheric pressure. In other words, the pressure in sealed voids 130A and 130B is below atmospheric pressure. As an example, the pressure in sealed voids 130A and 130B may range from approximately 0.1 Torr to approximately 10 Torr. The type of substance or material within sealed voids 130A and 130B is not a limitation of the present invention. For example, sealed voids 130A and 130B may contain a gas, a fluid, or a solid matter.

Vertical structure 136 may be, for example, a pillar, a column, or a wall, and may comprise a portion of substrate 110 and portions of dielectric layers 134A and 134B between voids 130A and 130B. Structures 136 may also be referred to as protrusions or projections. As is discussed below, active devices, or portions of active devices, are formed in substrate 110 and are not formed in material 110 of structure 136. In some embodiments, vertical structure 136 may comprise only portions of dielectric layers 134A and 134B.

Vertical structure 136 may be used to form a plurality of sealed voids or closed cells in dielectric platform 104. Although a single vertical structure 136 is shown in FIG. 1, the methods and apparatuses described herein are not limited in this regard. For example, in alternate embodiments, a plurality of vertical structures may be formed in dielectric platform 104. And, in other embodiments, such as the embodiment illustrated in FIG. 2, no vertical structures are formed in dielectric platform 104 and dielectric platform 104 has only a single sealed void 130A.

In embodiments wherein multiple voids are formed in dielectric platform 104, dielectric platform 104 has a closed-cell configuration in that the voids 130A and 130B of dielectric platform 104 may be physically isolated from each other by vertical structure 136. Although only two sealed voids 130A and 130B are shown in FIG. 1, the methods and apparatuses described herein are not limited in this regard. For example, as may be appreciated, dielectric platform 104 may include more than one vertical structure 136 to form more than two sealed voids in dielectric platform 104. Sealed voids 130A and 130B may be rectangular shaped, although the methods and apparatuses described herein are not limited in this regard.

Accordingly, if there is any rupture or fracture in dielectric platform 104, the effects of this rupture or fracture may be contained in a limited area due to the closed-cell configuration, wherein the multiple voids of dielectric platform 104 are physically isolated from each other. In one example, the closed cell configuration would prevent a fracture or rupture from introducing ambient gas into all of the voids comprising dielectric platform 104. Vertical structure 136 may also provide structural stability to and reduce flexing and potential failure of dielectric materials 118 and 120 and electrically conductive material 140. In some embodiments, the width of cavity 130A, the thickness of dielectric material 118, and the type of material used for dielectric material 118 are selected so that dielectric material 118 is rigid or substantially rigid. In some applications of dielectric platform 104 it is desirable for dielectric material 118 to be stiff, unbending, or inflexible.

Figure 2:
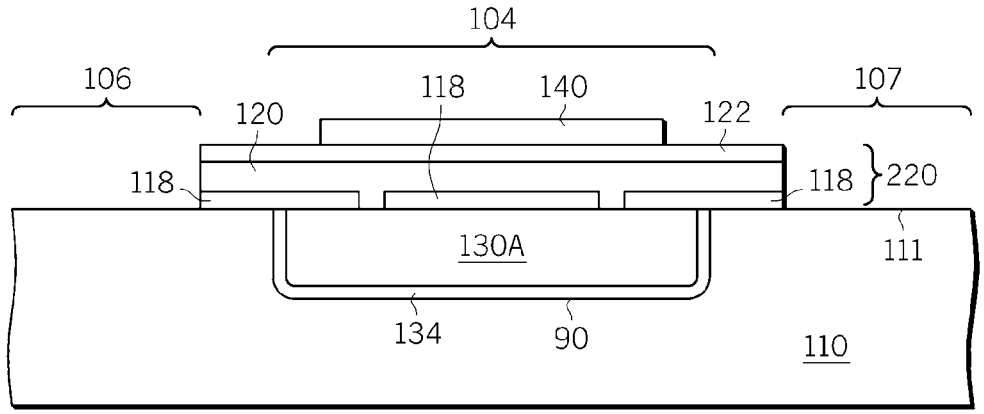
FIG. 2 is a cross-sectional view of another semiconductor structure in accordance with another embodiment of the present invention.

Layers 118, 120, and 122 together may form a dielectric cap structure 220. In contrast to sensors comprised of a cavity and a flexible cap, dielectric structure 220 of dielectric platform 104 shown in FIGS. 1 and 2 comprised of dielectric layers 118, 120 and 122 may be designed to be rigid, or substantially rigid in some embodiments. In a sensor the cap is flexible and elements embedded in the cap or formed over the cap are designed to sense the flexure of the cap and provide a signal proportional to the cap flexure. Dielectric structure 220 may be designed to be rigid, or substantially rigid such that the values of elements that may be formed on or within structure 220 are constant, or substantially constant. As discussed in some of the examples herein, the size and spatial relationship between the elements which comprise the dielectric platform 104 may be designed to form a rigid cap. For example, referring to FIG. 2 the width of sealed cavity 130A and the thickness of dielectric layers 118, 120 and 122 may be chosen such that structure 220 is rigid, or substantially rigid. In another example, referring to FIG. 1, one or more vertical structures 136 may be formed to increase the rigidity of structure 220. While the example in FIG. 1 shows one vertical structure 136, this is not a limitation of the present invention. In other examples, dielectric platform 104 may include a plurality of vertical structures 136. Vertical structures 136 may comprise, for example, posts or pillars having various shapes such as, for example, circular, square, or hexagonal, and for example, may comprise open or closed walls or wall segments. While the examples in FIGS. 1 and 2 show dielectric structure 220 comprised of three dielectric layers 118, 120 and 122, this is not a limitation of the present invention. In other embodiments, dielectric structure 220 may include more or fewer dielectric layers.

As is discussed with reference to FIGS. 8 and 9, openings 132A (FIG. 8) and 132B (FIG. 8) in dielectric material 118 are sealed with a portion of dielectric material 120. Although only one opening is shown as being formed above each void 710A (FIG. 8) and 710B (FIG. 8), the methods and apparatuses described herein are not limited in this regard. Alternatively, multiple openings may be formed in dielectric material 118 above each void. For example FIG. 2 shows a portion of dielectric material 120 filling two openings in dielectric material 118 associated with single sealed void 130A.

The combination of vertical structure 136 and voids 130A and 130B reduces the overall permittivity of the dielectric platform 104 so that dielectric platform 104 has a relatively low dielectric constant. In other words, sealed voids 130A and 130B and dielectric materials 134A and 134B together reduce the dielectric constant of dielectric platform 104. To minimize the dielectric constant of dielectric platform 104 it is desirable to increase the depth of dielectric platform 104, increase the volume of sealed voids 130A and 130B and reduce the extent of semiconductor material 110 contained in vertical structures 136. Increasing the depth of dielectric platform 104 while minimizing the extent of semiconductor material 110 contained in vertical structures 136 requires formation of high aspect ratio structures with a relatively small width compared to the depth. In some embodiments, a dielectric constant of about at least about 1.5 or lower may be achieved by increasing the volume of voids 130A and 130B relative to the volume of structure 136. The dielectric constant of dielectric platform 104 may also be reduced by increasing the volume of dielectric materials 134 and 134B in vertical structures 136. Since empty space has the lowest dielectric constant (the dielectric constant of empty space is 1), the more empty space or void space incorporated into the dielectric platform, the lower the overall dielectric constant. Accordingly, increasing the volume of sealed voids 130A and 130B relative to the volume of vertical structures 136 is more effective in decreasing the dielectric constant of dielectric platform 104 compared to increasing the volume of dielectric materials 134A and 134B in vertical structures 136.

The dielectric constant of dielectric platform 104 is reduced compared to, for example, what would be provided by a dielectric platform that has no air gaps or voids. Additionally, reduced thermal stress is induced in substrate 110 compared to a solid or filled dielectric structure (not shown), because dielectric platform 104 includes substantial volumes that are not occupied by solids having coefficients of thermal expansion that differ from that of substrate 110 and active layer 154. Thermal stress can lead to dislocations and undesirable excessive leakage currents in devices formed in substrate 110. Reduced stress in dielectric platform 104 is also achieved by eliminating the need for thick thermal oxide layers required in some alternate dielectric structures. Thick thermal oxides generate stress because of the 2.2× volume expansion that occurs when silicon is oxidized.

Silicon dioxide ($SiO_2$) has a dielectric constant of about 3.9. Accordingly, a solid or filled dielectric structure that includes no voids and includes silicon dioxide may have a dielectric constant of about 3.9.

In some embodiments described herein, dielectric platform 104 includes voids occupying in excess of 40% of the total volume of dielectric platform 104. This may result in an effective dielectric constant reduction of about 30% or greater, from a dielectric constant of about 3.9 to an effective dielectric constant of about 2.74. In one embodiment, dielectric platform 104 includes voids occupying in excess of 50% of the total volume. This may result in an effective dielectric constant reduction of about 39%, from a dielectric constant of about 3.9 to an effective dielectric constant of about 2.39. Increasing the volume of air or empty space in dielectric platform 104 may result in a dielectric platform 104 having a dielectric constant of about 1.5 or less. As a result, passive elements 140 formed over dielectric platform 104 have reduced parasitic capacitances to the substrate 110. The parasitic substrate capacitance is reduced by both the reduced effective dielectric constant of dielectric platform 104 and the increased thickness of dielectric platform 104.

Figure 3:
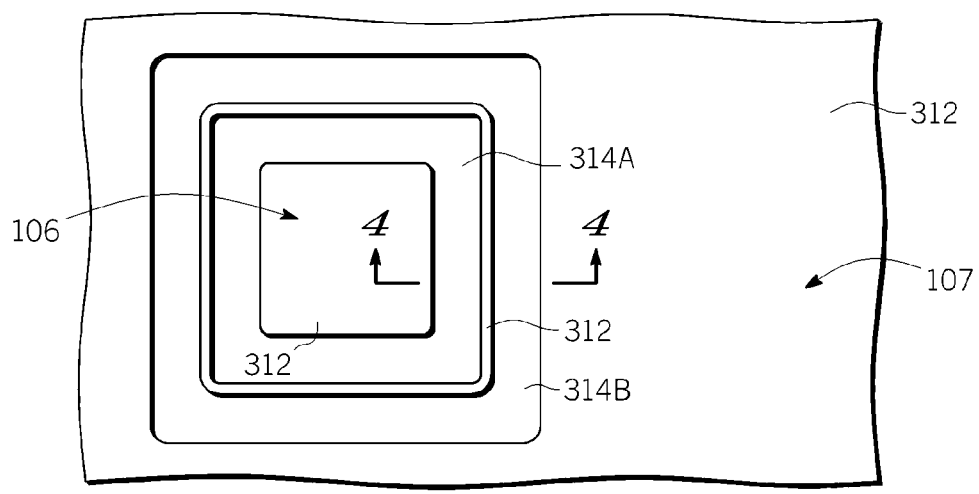
FIG. 3 is a top view of the semiconductor structure of FIG. 1 at an early stage of fabrication.
Figure 12:
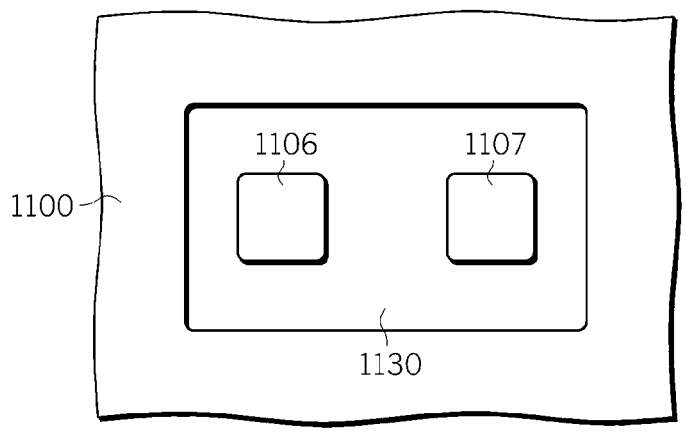
FIG. 12 is a top view of another semiconductor structure at an early stage of fabrication in accordance with yet another embodiment of the present invention.

Dielectric platform 104 may also be used to provide electrical isolation in semiconductor structure 100. For example, dielectric platform 104 may provide electrical isolation between active region 106 and active region 107. As is illustrated in FIG. 3, dielectric platform 104 (FIG. 1) may be formed to surround active region 106. Turning briefly to FIG. 12, FIG. 12 is a top view showing a semiconductor structure 1210 at an early stage of fabrication in which a single opening or trench 1130 surrounds active areas 1106 and 1107. At the stage of manufacturing illustrated in FIG. 12, a single opening or trench 1130 may be formed in a substrate 1100, leaving regions 1106 and 1107 that may be regions where actives devices, or portions of active devices, may be subsequently formed. In addition, trench 1130 may be used to form a dielectric platform (not shown) that may completely surround active areas 1106 and 1107. Although rectangular shaped active areas 1106 and 1107 and a rectangular shaped trench 1130 are illustrated in FIG. 12, this is not a limitation of the present invention. In other embodiments, trench 1130 and active areas 1106 and 1107 may have any arbitrary shape. Although the semiconductor structures illustrated herein are described as surrounding at least one active area, this is not a limitation of the present invention. In other embodiments, the dielectric platform may be formed adjacent to or abutting an active area, but not surrounding the active area.

Figure 11:
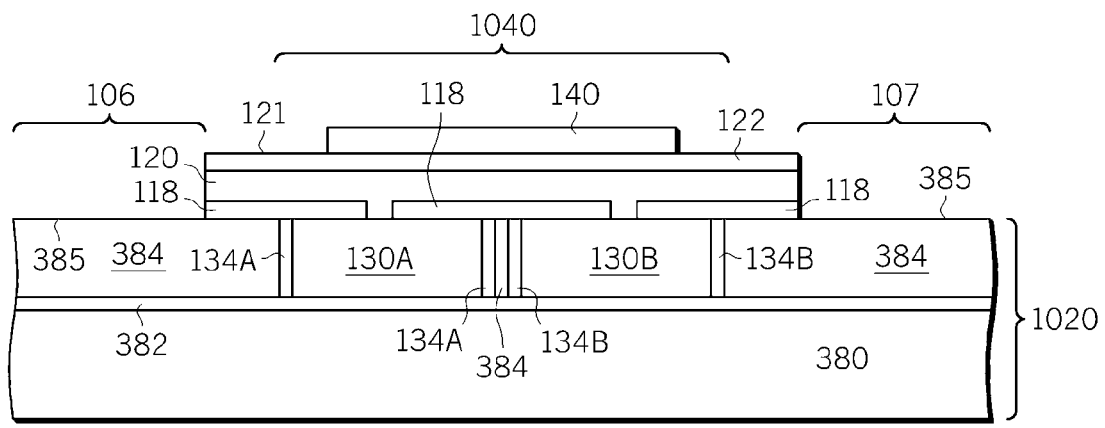
FIG. 11 is a cross-sectional view of another semiconductor structure in accordance with another embodiment of the present invention.

In another example shown in FIG. 11, semiconductor structure 1010 may include a semiconductor on insulator (SOI) substrate 1020 comprised of substrate layer or handle wafer 380, a buried oxide layer (BOX) layer 382 and an active layer or device layer 384. Semiconductor structure 1010 may further include a dielectric platform 1040 formed such that in one embodiment buried oxide layer 382 may be at least about one micron or greater below an upper surface 385 of device layer 384 and a portion of the buried oxide layer 382 forms a portion or all of the dielectric material at the bottom of sealed voids 130A and 130B. In other words, the dielectric layer on the bottom of sealed voids 130A (FIG. 11) and 130B (FIG. 11) may be comprised of a portion of the buried oxide layer 382. In another embodiment, the dielectric layer on the bottom of sealed voids 130A (FIG. 11) and 130B (FIG. 11) may be comprised of a portion of the buried oxide layer 382 as well as a portion of dielectric layer 134A and 134B. In some embodiments, dielectric platform 1040 may be used to completely electrically isolate active regions 106 and 107 from each other, which may also result in electrical isolation between any active devices formed in active regions 106 and 107. In these embodiments, dielectric platform 1040 may also fully surround either active region 106 or active region 107 or both. In the example illustrated in FIG. 11, the BOX layer 382 is shown as essentially coplanar with the bottom of dielectric platform 104. This is not a limitation of the present invention, in other embodiments the bottom of the dielectric platform 104 may not be coplanar with BOX layer 382, for example, the bottom of dielectric platform 104 may be below BOX layer 382.

Turning back to FIG. 1, since at least a portion of dielectric platform 104 is formed in and below the surface of the substrate 110 in some embodiments, dielectric platform 104 may be referred to as an embedded dielectric structure in these embodiments.

In addition, dielectric platform 104 may be used to increase the frequency of operation of any devices formed using semiconductor structure 100. For example, passive components such as, for example, inductors, capacitors, or electrical interconnects, may be formed over the embedded dielectric platform 104 and may have reduced parasitic capacitive coupling between these passive components and substrate 110 since the embedded dielectric platform 104 has a relatively low dielectric constant or permittivity and since the embedded dielectric platform 104 increases the distance between the passive components and the conductive substrate. Reducing parasitic substrate capacitances may increase the frequency of operation of any devices formed using semiconductor structure 100. As an example, the passive component may comprise electrically conductive material 140, wherein electrically conductive material 140 may comprise, for example, aluminum, copper, or doped polycrystalline silicon. In various examples, the passive component may be an inductor, a capacitor, a resistor, or an electrical interconnect and may be coupled to one or more active devices formed in active regions 106 and 107.

Further, dielectric platform 104 may be used to form relatively high quality passive devices such as, for example, capacitors and inductors having a relatively high quality factor (Q) since the dielectric platform 104 may be used to isolate and separate the passive devices from the substrate. Active devices, such as transistors or diodes, may be formed in regions adjacent to, or abutting, the dielectric platform 104, and these active devices may be coupled to employ passive components such as spiral inductors, interconnects, microstrip transmission lines and the like that are formed on a planar upper surface of dielectric platform 104. Separating the passive components from substrate 110 allows higher Q's to be realized for these passive components.

As an example, a field effect transistor (FET) 156 may be formed in active region 106. FET 156 may be a MOSFET and may include a source region 158 in a portion of substrate 110, a drain region 160 in a portion of substrate 110, a gate oxide 164 over a portion of substrate 110, a gate 162 over gate oxide 164, and a channel region 166 formed in a portion of substrate 110 under gate oxide 164 and between doped regions 158 and 160.

Substrate 110 may serve as part of a drain region of a vertical transistor formed in active region 107. In this example, a source contact or electrode (not shown) may be formed on or adjacent to an upper surface of substrate 110 and a drain electrode (not shown) may be formed on or adjacent to a lower surface of substrate 110. During operation, the electrical current flow from the source electrode to the drain electrode in the vertical transistor may be substantially perpendicular to the upper and lower surfaces of semiconductor structure 110. In other words, current flows essentially vertically through the vertical transistor from the electrode located adjacent a top surface of semiconductor structure 100 to a drain electrode located adjacent to the opposite bottom surface of semiconductor structure 100. An example of a vertical transistor is described in U.S. patent application Ser. No. 10/557,135, entitled "POWER SEMICONDUCTOR DEVICE AND METHOD THEREFOR," filed Nov. 17, 2005, which claims priority to Patent Cooperation Treaty (PCT) International Application Number PCT/US2005/000205 entitled "POWER SEMICONDUCTOR DEVICE AND METHOD THEREFOR," having an International Filing Date of Jan. 6, 2005 and an International Publication Date of Jul. 28, 2005, the contents of both of these patent applications are incorporated herein by reference in their entirety.

Although only a single active device is discussed as being formed in substrate 110 of active regions 106 and 107, the methods and apparatuses described herein are not limited in this regard. In some embodiments, a plurality of active devices may be formed in active regions 106 and 107 of substrate 110.

FIG. 2 shows a cross-sectional view of a semiconductor structure 200. Semiconductor structure 200 is similar to semiconductor structure 100 of FIG. 1. Dielectric platform 104 of semiconductor structure 200 does not include any vertical structures, such as vertical structure 136 (FIG. 1). Rather, dielectric platform 104 comprises a single sealed void 130A.

FIGS. 1 and 2 show an example of an air-gap dielectric platform 104. For example, the air-gap dielectric platform 104 of FIGS. 1 and 2 contain one or more sealed voids 130 that act to reduce the dielectric constant of the dielectric platform. In contrast, a filled dielectric platform (not shown) has no voids, but is comprised of materials with lower dielectric constants than the substrate. Since empty space has the lowest dielectric constant (the dielectric constant of empty space is 1), the more empty space or void space incorporated into the dielectric platform, the lower the overall dielectric constant. One difficulty in forming an air-gap dielectric platform is that the cavities that will become the sealed voids need to be capped. Accordingly, it may be desirable in some applications that the cavity width or opening dimension be relatively small to permit capping without filling or partially filling the cavity. In some examples the cavity width or opening dimension is limited to a range from about 0.8 microns (μm) to about 1.3 μm. This may limit the volume of sealed void space in the dielectric platform, resulting in a higher dielectric constant. Furthermore, lithography and etching of such relatively small features is difficult and may require expensive equipment.

The air-gap dielectric platform fabrication methods disclosed herein relaxes the cavity width or opening dimension, resulting in a lower dielectric constant as well as relatively easier, higher yield and less expensive processing.

Figure 4:
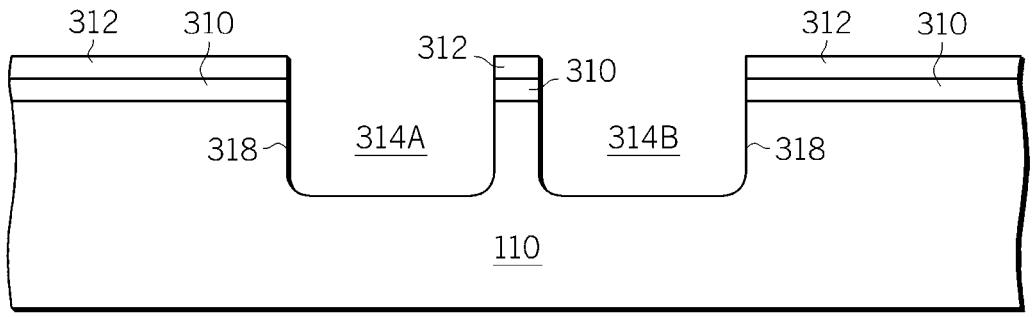
FIG. 4 is a cross-sectional view of the semiconductor structure of FIG. 3 taken along section line 4-4 of FIG. 3.

FIGS. 3 to 10 illustrate at least one embodiment for making structure 100 of FIG. 1. Turning to FIGS. 3 and 4, FIG. 3 is a top view of the semiconductor structure 100 of FIG. 1 at an early stage of fabrication and FIG. 4 shows a cross-sectional view of semiconductor structure 100 taken along section line 4-4 of FIG. 3. At the stage illustrated in FIGS. 3 and 4, a dielectric layer 310 is formed over substrate 110 and dielectric layer 312 is formed over dielectric layer 310. In one example dielectric layer 310 may be silicon dioxide and dielectric layer 312 may be silicon nitride. Dielectric layer 310 may comprise, for example, silicon dioxide and has a thickness ranging from about 50 Angstroms (Å) to about 2000 Angstroms. Dielectric layer 310 may be formed using deposition techniques or thermal growth techniques such as, for example, thermal oxidation of silicon. Dielectric layer 312 may comprise, for example, silicon nitride ($Si_3N_4$) and has a thickness ranging from about 100 Angstroms (Å) to about 8000 Angstroms. Dielectric layer 312 may be formed using deposition techniques, for example, low pressure chemical vapor deposition (LPVCD) of silicon nitride.

Portions of substrate 110 and layers 310 and 312 are removed to form openings 314A and 314B. Openings 314A and 314B may also be referred to as trenches or cavities. Openings 314A and 314B may be formed using at least one etching operation. In some embodiments, two or three etching operations may be used to form openings 314A and 314B. Openings 314A and 314B are used to form the sealed voids 130A (FIG. 1) and 130B (FIG. 1) of the resulting dielectric platform 104 (FIG. 1).

After dielectric layer 312 is formed, dielectric layer 312 and dielectric layer 310 and substrate 110 may be patterned using photolithography and etching processes. Photolithography processes or operations involve the use of masks and may sometimes be referred to as masking operations or acts. The photolithography and etching may include forming a layer of a radiation-sensitive material, such as, for example, photoresist (not shown), over dielectric layer 312, then exposing the photoresist using, for example, ultraviolet (UV) radiation to form a mask, and then etching portions of dielectric layer 312, dielectric layer 310 and substrate 110 to form openings 314A and 314B.

Silicon nitride layer 312 may be etched using a wet chemical etch or a dry etch process such as, for example, a reactive ion etch (RIE). Silicon dioxide layer 310 may be etched using a wet chemical etch or a dry etch process such as, for example, a reactive ion etch (RIE). A portion of substrate 110 may next be removed using a wet chemical etch or a dry etch process such as, for example, reactive ion etching (RIE). The etch process for formation of openings 314A and 314B is preferably anisotropic, but in some examples may be isotropic. After the etching of a portion of substrate 110, the photoresist over silicon nitride layer 312 is stripped or removed.

In some embodiments exterior sidewalls 318 of openings 314A and 314B serve as termination for equipotential lines during depletion of active devices formed in active regions 106 and/or 107. Thus, as is discussed further below, equipotential lines impinge on exterior sidewalls 318. In other words, a termination structure comprising exterior sidewalls 318 provides termination for equipotential lines from an electric field in an active area formed adjacent to the termination structure. It may be desirable for exterior sidewalls 318 of openings 314A and 314B to be straight and smooth and perpendicular to the surface of substrate 110 so that the equipotential lines are substantially perpendicular to exterior sidewalls 318 so that a condition that is referred to as planar breakdown is achieved where equipotential lines terminate at a perpendicular angle, or a substantially perpendicular angle, to the exterior sidewalls 318. Equipotential lines that impinge on exterior sidewalls 318 at an angle that is not perpendicular to sidewalls 318 may decrease the breakdown voltage of active devices formed in active region 106, active region 107, or both.

Dielectric layer 312 or a combination of dielectric layer 310 and dielectric layer 312 may serve as a hard mask, and may be referred to as a masking layer. Since the photoresist (not shown) over dielectric 312 is also etched as part of the etch used to etch portions of substrate 110, dielectric layer 312 or a combination of dielectric layer 310 and dielectric layer 312 may be used as a hard mask to prevent the undesired etching of the upper surface of substrate 110 during the formation of openings 314A and 314B. In alternate embodiments, the photoresist layer may be made relatively thick such that it is not completely eroded during the etching process.

Figure 5:
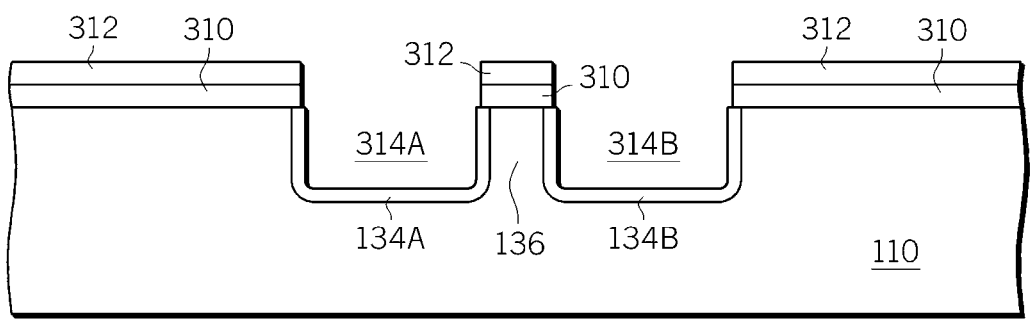
FIG. 5 is a cross-sectional view of the semiconductor structure of FIG. 4 at a later stage of fabrication.

As is shown in FIG. 5, one or more vertical structures 136 may be formed as part of the etching of layers 310, 312 and portions of substrate 110. Vertical structure 136 may be used for mechanical support in dielectric platform 104 (FIG. 1) as well as a partition for forming multiple closed cells or voids in dielectric platform 104. In some embodiments, the width of structures 136 ranges from about 0.6 microns to about 5 microns.

Although multiple openings 314A and 314B are shown as being formed in FIG. 4, the methods and apparatuses described herein are not limited in this regard. For example, in alternate embodiments, a single opening may be formed in layers 312 and 310 and portions of substrate 110 which may be used to form the semiconductor structure 200 having a single sealed void 130A shown in FIG. 2.

FIG. 5 shows a cross-sectional view of semiconductor structure 100 at a later stage of fabrication. After forming openings 314A and 314B, dielectric layers 134A and 134B are formed over the exposed surfaces of substrate 110 in openings 314A and 314B, respectively. Dielectric layers 134A and 134B may protect and or passivate the exposed surfaces of substrate 110 in the sealed voids 130A (FIG. 1) and 130B (FIG. 1). Dielectric layers 134A and 134B comprise, for example, silicon dioxide ($SiO_2$) and have a thickness ranging from about 50 Angstroms (Å) to about 5000 Angstroms. Dielectric layers 134A and 134B may be formed using deposition techniques or thermal growth techniques such as, for example, thermal oxidation of silicon. In one example, substrate 110 is silicon and dielectric layers 134A and 134B are silicon dioxide and dielectric layers 134A and 134B form a passivation layer on the silicon surface, thus protecting the silicon surface and stabilizing the charge density at the silicon surface.

Figure 6:
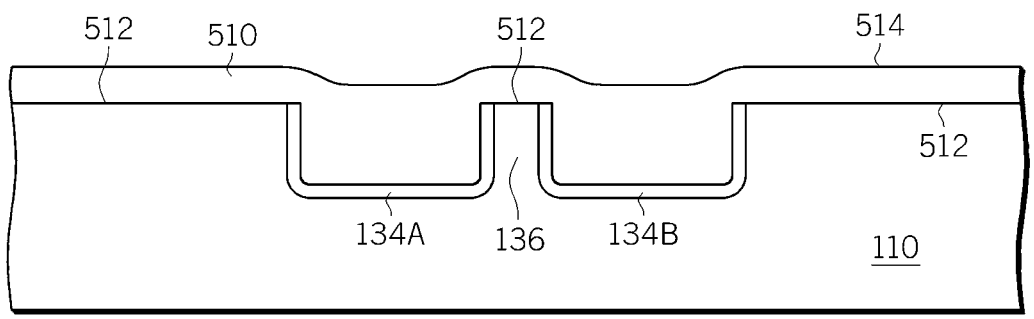
FIG. 6 is a cross-sectional view of the semiconductor structure of FIG. 5 at a later stage of fabrication.

FIG. 6 shows a cross-sectional view of semiconductor structure 100 at a later stage of fabrication. After forming dielectric layers 134A and 134B, dielectric layer 312 and/or dielectric layer 310 are removed. Dielectric layer 312 and/or dielectric layer 310 may be removed, for example, by wet chemical etching or dry reactive ion etching. Removal of dielectric layer 312 and/or dielectric layer 310 is optional and in an alternate embodiment may be left in place. In FIG. 6 dielectric layer 312 and dielectric layer 310 have been removed. Substrate 110 at this stage of manufacture has an upper surface 512.

After optional removal of dielectric layer 312 and/or dielectric layer 310, layer 510 is formed over substrate 110 and dielectric layers 134A and 134B. Layer 510 may be used to provide a planar surface for structure 100 for subsequent processing steps. The thickness of layer 510 is sufficient to completely fill openings 314A (FIG. 5) and 314B (FIG. 5) and extend above surface 512. In one example the amount that layer 510 extends above surface 512 has a range from 100 Angstroms (Å) to two times the depth of openings 314A (FIG. 5) and 314B (FIG. 5).

Figure 7:
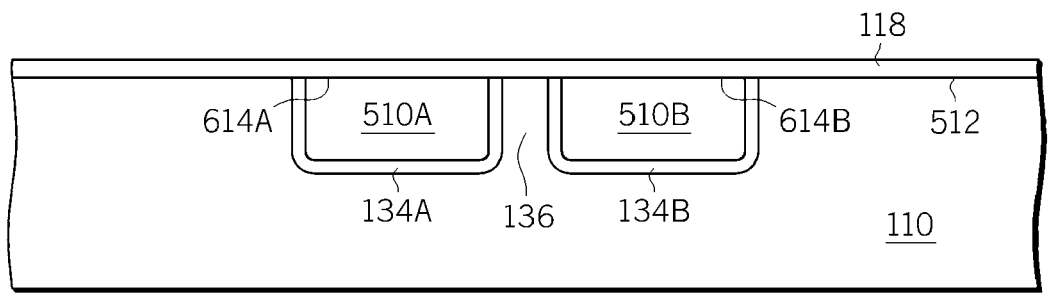
FIG. 7 is a cross-sectional view of the semiconductor structure of FIG. 6 at a later stage of fabrication.

In one example layer 510 acts to planarize the surface of semiconductor structure 100 at this stage of manufacture. In other words, layer 510 provides a substantially planar service for subsequent processing of structure 100. Planarization reduces the topography of a structure which may be advantageous in some applications. In FIG. 6, layer 510 is thicker in the regions over openings 314A (FIG. 5) and 314B (FIG. 5) than over upper surface 512 of substrate 110, reducing the topography of semiconductor structure 100 at this stage of manufacture and creating a surface 514 that reduces the topography of structure 100. In one example the height variation of surface 514 has a range of 100 Angstroms (Å) to 5 microns (μm). In one example the thickness of layer 510 over surface 512 has a range of 1000 Angstroms (Å) to 10 microns (μm). Layer 510 may be planarized to further reduce the topography of surface 514. In one example layer 510 is planarized using for example, chemical mechanical planarization (CMP), to remove substantially all of layer 510 over surface 512 resulting in surfaces 614A (FIG. 7) and 614B (FIG. 7) that are coplanar with, or substantially coplanar with, surface 512 (FIG. 7). In one example layer 510 comprises silicon dioxide ($SiO_2$), silicon nitride ($Si_3N_4$) or an organic polymer and may be formed using deposition techniques, for example low temperature chemical vapor deposition or spin-on deposition. In one example layer 510 comprises an organic polymer fill material such as, for example ACCUFLO® T-27 (ACCUFLO® is a registered trademark of Honeywell International Inc. for its family of organic polymers for fill and planarization of topographies) and is formed using spin on deposition.

FIG. 7 shows a cross-sectional view of semiconductor structure 100 at a later stage of fabrication. After planarization of layer 510, the remaining portions of layer 510 are labeled 510A and 510B. Portions of layers 510A and 510B are sacrificial layers or materials and have surfaces 614A and 614B, respectively. Surfaces 614A and 614B are coplanar to, or substantially coplanar to, surface 512. Surfaces 614A, 614B, and 512 together form a planar surface, or a substantially planar surface, that may be used for forming subsequent planar layers such as, for example, dielectric layer 118. For example, after planarization of layer 510, dielectric layer 118 is formed over the exposed surface 512 of substrate 110 and the exposed surfaces 614A and 614B. Dielectric layer 118 comprises, for example, silicon dioxide ($SiO_2$) and has a thickness ranging from about 50 Angstroms (Å) to about 2 microns (μm). Dielectric layer 118 may be formed using deposition techniques such as, for example, low temperature chemical vapor deposition or spin-on deposition. In one embodiment dielectric layer 118 comprises silicon dioxide and has a thickness ranging from 2500 Angstroms (Å) to about 2 microns (μm).

In some cases the planarization material 510 may not be thermally stable at high temperatures. Some candidate materials are only stable to 250-300° C. This then limits the temperature range for formation of dielectric layer 118. In this example, dielectric layer 118 may be formed using a very low temperature deposition process or spin-on deposition. In the latter example, the spin on material is cured at a temperature less than that which will decompose the planarization material 510. In some embodiments, the spin on material is cured at a temperature of about 600° C. or less, In one example dielectric layer 118 comprises a spin-on glass such as ACCUGLASS® T-11, T12B or T14 (ACCUGLASS® is a registered trademark of Honeywell International Inc. for its family of methylsiloxane polymers for interlevel and overcoat passivation) or preferably a silicate spin-on glass with zero organic content such as T-03AS (also manufactured by Honeywell International Inc.) and has a thickness ranging from 500 Angstroms (Å) to about 10,000 Angstroms (Å).

Figure 8:
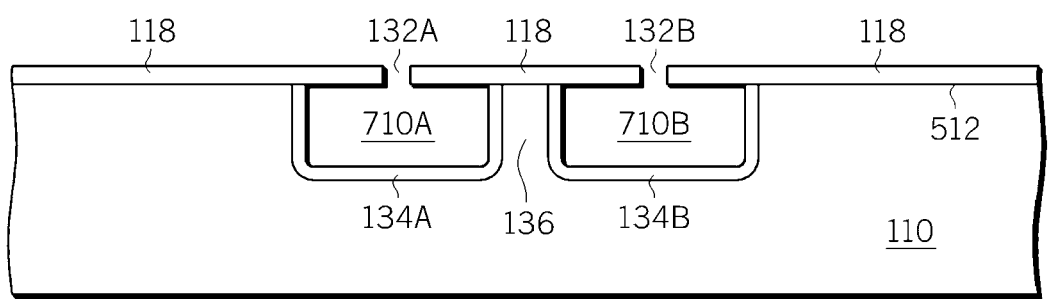
FIG. 8 is a cross-sectional view of the semiconductor structure of FIG. 7 at a later stage of fabrication.

FIG. 8 is a cross-sectional view of semiconductor structure 100 at a later stage of fabrication. After formation of dielectric layer 118, openings 132A and 132B are formed in dielectric layer 118 exposing surfaces 614A (FIG. 7) and 614B (FIG. 7) of layers 510A (FIG. 7) and 510B (FIG. 7), respectively. In some embodiments, the diameter or width of openings 132A and 132B ranges from about 0.25 microns to about 2.5 microns.

FIG. 8 shows two voids 710A and 710B and one opening in dielectric layer 118 associated with each void, although the methods and apparatuses described herein are not limited in this regard. In some embodiments there may only be one void and two openings as is illustrated in FIG. 2 which was formed using two openings in dielectric layer 118 associated with one sealed void 130A. In other embodiments there may be multiple openings associated with multiple voids.

After dielectric layer 118 is formed, openings 132A and 132B are formed in dielectric layer 118. In the embodiment wherein dielectric layer 118 is silicon dioxide, silicon dioxide layer 118 may be etched using a wet chemical etch or a dry etch process such as, for example, a reactive ion etch (RIE).

After openings 132A and 132B are formed in dielectric layer 118 sacrificial materials 510A (FIG. 7) and 510B (FIG. 7) are removed through openings 132A and 132B. Layers 510A (FIG. 7) and 510B (FIG. 7) may be removed using a wet chemical etch or a dry etch process such as, for example, a reactive ion etch (RIE). In the embodiment where layers 510A (FIG. 7) and 510B (FIG. 7) are an organic polymer, layers 510A (FIG. 7) and 510B (FIG. 7), may, for example, be removed by exposure to an oxygen plasma. Removal of layer layers 510A (FIG. 7) and 510B (FIG. 7), results in formation of open voids or cavities 710A and 710B, respectively. Dielectric material 118 may be rigid or substantially rigid after removal of layers 510A (FIG. 7) and 510B (FIG. 7).

Figure 9:
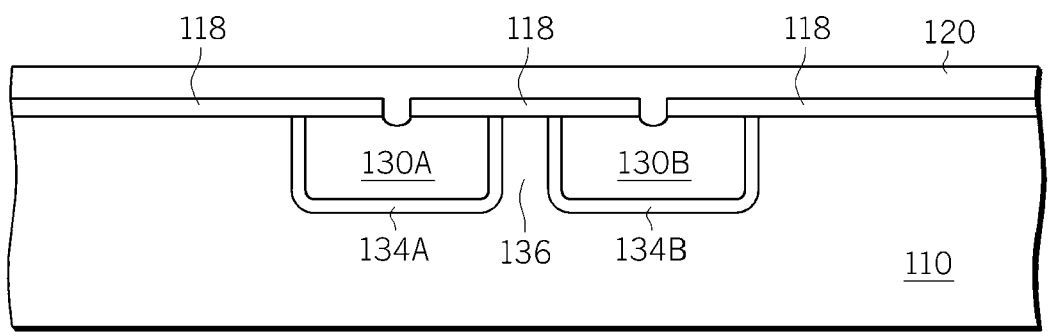
FIG. 9 is a cross-sectional view of the semiconductor structure of FIG. 8 at a later stage of fabrication.

FIG. 9 shows a cross-sectional view of semiconductor structure 100 at a later stage of fabrication. After formation of open voids 710A and 710B dielectric layer 120 is formed over dielectric layer 118. Dielectric layer 120 seals, plugs, or caps openings 132A (FIG. 8) and 132B (FIG. 8) and forms sealed voids 130A and 130B. Openings 132A and 132B may also be referred to as filled openings at this stage of fabrication. In some embodiments, open voids or cavities 710A (FIG. 8) and 710B (FIG. 8) are sealed under a vacuum. However, sealed cavities 130A and 130B may be filled with a fluid such as, for example, air. Dielectric layer 120 comprises, for example, silicon dioxide ($SiO_2$) and has a thickness ranging from about 1500 Angstroms (Å) to about 5 microns (μm). Dielectric layer 120 may be formed using deposition techniques such as, for example, low temperature chemical vapor deposition. The material of dielectric layer 120 may enter a portion of voids 710A and 710B, but it does not fill the voids, thereby forming sealed voids 130A and 130B. Second dielectric layer 120 may then be optionally planarized using, for example, a Chemical Mechanical Planarization ("CMP") technique.

Figure 10:
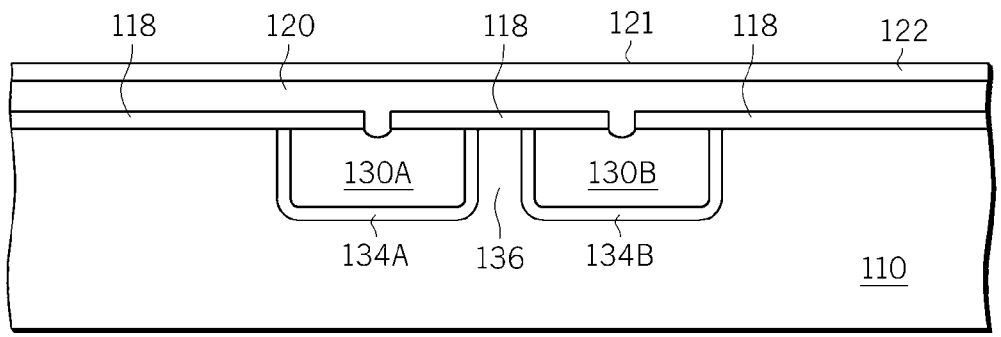
FIG. 10 is a cross-sectional view of the semiconductor structure of FIG. 9 at a later stage of fabrication.

FIG. 10 shows a cross-sectional view of semiconductor structure 100 at a later stage of fabrication. After optional planarization of dielectric layer 120, dielectric layer 122 is optionally formed over dielectric layer 120. Dielectric layer 122 may be a planar layer having a planar surface, or a substantially planar surface 121. Dielectric layer 122 may have a thickness ranging from about 100 Angstroms (Å) to about 5000 Angstroms. Dielectric layer 122 may comprise, for example, silicon nitride ($Si_3N_4$), and may be formed over silicon dioxide layer 120 to hermetically seal voids 130A and 130B. In other words, in embodiments where dielectric layer 120 is a silicon dioxide layer, the optional conformal silicon nitride layer 122 may prevent diffusion through and/or fill in any cracks in the silicon dioxide capping layer 75, and in general prevent the propagation of gases or moisture into sealed voids 130A and 130B through dielectric layers 118 and 120. Silicon nitride layer 122 may be formed using a low pressure chemical vapor deposition (LPCVD) and may have a thickness of about 500-2000 Angstroms. A partial vacuum may be formed in sealed cavities 130A and 130B as part of the LPCVD process.

A portion of a dielectric material 118, a portion of a dielectric material 120, a portion of a dielectric materials 134A and 134B, a portion of a dielectric material 122 and a vertical structure 136 in combination with sealed cavities 130A and 130B together form dielectric platform 104 shown in FIG. 1. The portions of dielectric layer 122, dielectric layer 120 and dielectric layer 118 over active regions 106 and 107 are removed. Active and passive semiconductor devices may be formed in or from the portions of substrate 110 adjacent dielectric platform 104. In addition, active or passive circuit elements may be formed on dielectric platform 104. As an example, the passive component may comprise electrically conductive material 140 (FIG. 1), wherein electrically conductive material 140 may comprise, for example, aluminum, copper, or doped polycrystalline silicon. In various examples, the passive component may be an inductor, a capacitor, a resistor, or an electrical interconnect.

As is discussed above, since empty space has the lowest dielectric constant (the dielectric constant of empty space is 1), the more empty space or void space incorporated into the dielectric platform, the lower the overall dielectric constant. Accordingly, to increase the amount of empty space in dielectric platform 104, in some embodiments, the width of opening 132A is substantially less than the width of cavity 130A and the width of structure 136 is substantially less than the width of cavity 130A. For example, the width of cavity 130A is more than about two times (2×) the width of opening 132A and the width of cavity 130A is more than about two times (2×) the width of structure 136. By way of example, the width of cavity 130A is about 1.5 microns or greater and the width of opening 132A is less than about 0.75 microns and the width of structure 136 is less than about 0.75 microns.

Accordingly, various structures and methods have been disclosed to provide a relatively thick, embedded dielectric platform that may be a dielectric support structure capable of supporting one or more passive devices over the dielectric platform. In various embodiments, the disclosed dielectric platform may provide electrical isolation, reduce parasitic substrate capacitance, allow for the formation of passive devices having a relatively high Q, and enable relatively higher frequency of operation or breakdown voltages of any devices formed using, or in conjunction with, a structure that includes the disclosed dielectric platform. In addition, the disclosed dielectric platform and the methods for making the dielectric platform may reduce stress that may be imparted to regions adjacent to the dielectric platform compared to other techniques and structures.

Although specific embodiments have been disclosed herein, it is not intended that the invention be limited to the disclosed embodiments. Those skilled in the art will recognize that modifications and variations can be made without departing from the spirit of the invention. It is intended that the invention encompass all such modifications and variations as fall within the scope of the appended claims.

What is claimed is:

1. A semiconductor structure, comprising:
   a semiconductor material;
   a first cavity that extends into the semiconductor material from a first surface of the semiconductor material at least about one micron or greater, having void space or an electrically non-conductive material inside the first cavity, or combinations thereof;
   a first protrusion extending from a first boundary of the first cavity a distance of at least about one micron or greater;
   a first dielectric material over the first cavity, over at least a portion of the first surface of the semiconductor material, and over at least a portion of a first surface of the first protrusion, wherein the first dielectric material has a first opening over a portion of the cavity, wherein the width of the first cavity is more than about two times (2×) the width of the first opening and the width of the first cavity is more than about two times (2×) the width of the first protrusion,
   wherein the first dielectric material is rigid or substantially rigid and further comprising:
   a second dielectric material over the first dielectric material, wherein a portion of the second dielectric is in the first opening of the first dielectric material to seal the first cavity;
   a third dielectric material over the second dielectric material, wherein the third dielectric material has a planar surface or a substantially planar surface;
   an electrically conductive material over at least a portion of the third dielectric material, and wherein the semiconductor material comprises silicon, the first protrusion comprises silicon or silicon dioxide, or combinations thereof, the first dielectric material comprises silicon dioxide ($SiO_2$) or a spin-on glass, the second dielectric material comprises silicon dioxide SiO), the third dielectric material comprises silicon nitride ($Si_3N_4$), and the electrically conductive material comprises aluminum, copper, or doped polycrystalline silicon.

2. The semiconductor structure of claim 1, wherein the width of the first cavity is about 1.5 microns or greater, the first dielectric material has a thickness ranging from about 50 Angstroms (Å) to about 2 microns (µm), the second dielectric material has a thickness ranging from about 1500 Angstroms (Å) to about 5 microns (µm), and the third dielectric material has a thickness ranging from about 100 Angstroms (Å) to about 5000 Angstroms.

3. The semiconductor structure of claim 1, wherein the first dielectric material comprises a spin-on glass and has a thickness ranging from 500 Angstroms (Å) to about 20,000 Angstroms (Å).

4. The semiconductor structure of claim 1, wherein the first dielectric material has a second opening spaced apart from the first opening of the first dielectric material.

5. The semiconductor structure of claim 1, wherein the first protrusion is a pillar.

6. The semiconductor structure of claim 1, wherein the first protrusion is an elongated wall.

7. The semiconductor structure of claim 1, further comprising a second cavity isolated from the first cavity, wherein the first protrusion is between the first cavity and the second cavity.

8. The semiconductor structure of claim 7, wherein a distance from a second boundary of the first cavity to a first boundary of the second cavity is at least about three microns or greater, wherein the second boundary of the first cavity is parallel to, or substantially parallel to, the first boundary of the second cavity and the second boundary of the first cavity is perpendicular to, or substantially perpendicular to, the first surface of the semiconductor material.

9. The semiconductor structure of claim 7, wherein the first protrusion surrounds the first cavity, wherein a first surface of the first protrusion is coplanar to, or substantially coplanar to, the first surface of the semiconductor material.

10. The semiconductor structure of claim 1, further comprising a semiconductor on insulator (SOI) substrate that comprises a buried oxide layer and the semiconductor material over the buried oxide layer, wherein the first cavity abuts the buried oxide layer.

11. The semiconductor structure of claim 1, further comprising an active device with at least a portion of the active device in the semiconductor material.

12. The semiconductor structure of claim 11, wherein the active device has a first doped region in the semiconductor material.

13. A semiconductor structure, comprising:
a semiconductor material;
a first cavity that extends into the semiconductor material from a first surface of the semiconductor material at least about one micron or greater;
a first protrusion extending from a first boundary of the first cavity a distance of at least about one micron or greater;
a first dielectric material over the first cavity, over at least a portion of the first surface of the semiconductor material, and over at least a portion of a first surface of the first protrusion, wherein the first dielectric material has a first opening over a portion of the cavity, wherein the width of the first cavity is more than about two times (2×) the width of the first opening and the width of the first cavity is more than about two times (2×) the width of the first protrusion, wherein the first dielectric material is rigid or substantially rigid and further comprising:
a second dielectric material over the first dielectric material, wherein a portion of the second dielectric is in the first opening of the first dielectric material to seal the first cavity;
a third dielectric material over the second dielectric material, wherein the third dielectric material has a planar surface or a substantially planar surface; and
an electrically conductive material over at least a portion of the third dielectric material, wherein the semiconductor material comprises silicon, the first protrusion comprises silicon or silicon dioxide, or combinations thereof, the first dielectric material comprises silicon dioxide ($SiO_2$) or a spin-on glass, the second dielectric material comprises silicon dioxide ($SiO_2$), the third dielectric material comprises silicon nitride ($Si_3N_4$), and the electrically conductive material comprises aluminum, copper, or doped polycrystalline silicon.

14. The semiconductor structure of claim 13, further comprising a semiconductor on insulator (SOI) substrate that comprises a buried oxide layer and the semiconductor material over the buried oxide layer, wherein the first cavity abuts the buried oxide layer.

15. The semiconductor structure of claim 13, further comprising an active device with at least a portion of the active device in the semiconductor material.

16. A semiconductor structure, comprising:
a semiconductor material;
a first cavity that extends into the semiconductor material from a first surface of the semiconductor material at least about one micron or greater, having void space or an electrically non-conductive material inside the first cavity, or combinations thereof;
a first protrusion extending from a first boundary of the first cavity a distance of at least about one micron or greater;
a first dielectric material over the first cavity, over at least a portion of the first surface of the semiconductor material, and over at least a portion of a first surface of the first protrusion, wherein the first dielectric material has a first opening over a portion of the cavity, wherein the width of the first cavity is more than about two times (2×) the width of the first opening and the width of the first cavity is more than about two times (2×) the width of the first protrusion, and wherein a pressure in the first cavity is below atmospheric pressure.

17. The semiconductor structure of claim 16, further comprising a second cavity isolated from the first cavity, wherein the first protrusion is between the first cavity and the second cavity.

18. A semiconductor structure, comprising:
a semiconductor material;
a first cavity that extends into the semiconductor material from a first surface of the semiconductor material at least about one micron or greater, having void space or an electrically non-conductive material inside the first cavity, or combinations thereof;
a first protrusion extending from a first boundary of the first cavity a distance of at least about one micron or greater;
a second cavity isolated from the first cavity, wherein the first protrusion is between the first cavity and the second cavity;
a first dielectric material over the first cavity, over at least a portion of the first surface of the semiconductor material, and over at least a portion of a first surface of the first protrusion, wherein the first dielectric material has a first opening over a portion of the cavity, wherein the width of the first cavity is more than about two times (2×) the width of the first opening and the width of the first cavity is more than about two times (2×) the width of the first protrusion, and wherein the first cavity surrounds a portion of the semiconductor material and the second cavity surrounds the first cavity.

19. The semiconductor structure of claim 18, further comprising a semiconductor on insulator (SOI) substrate that comprises a buried oxide layer and the semiconductor material over the buried oxide layer, wherein the first cavity abuts the buried oxide layer.

* * * * *